(12) United States Patent
Choi et al.

(10) Patent No.: US 12,315,584 B2
(45) Date of Patent: May 27, 2025

(54) METHOD FOR FINDING COMMON OPTIMAL REFERENCE VOLTAGE AND MEMORY STORAGE SYSTEM

(71) Applicant: INNOGRIT TECHNOLOGIES CO., LTD., Shanghai (CN)

(72) Inventors: Youngjoon Choi, Shanghai (CN); Goyo Chiang, Shanghai (CN)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 241 days.

(21) Appl. No.: 18/194,209

(22) Filed: Mar. 31, 2023

(65) Prior Publication Data

US 2023/0317201 A1   Oct. 5, 2023

(30) Foreign Application Priority Data

Mar. 31, 2022   (CN) .......................... 202210343438.4

(51) Int. Cl.
  *G11C 16/26*  (2006.01)
  *G11C 7/14*   (2006.01)
  *G11C 8/08*   (2006.01)
  *G11C 29/52*  (2006.01)

(52) U.S. Cl.
  CPC ................ *G11C 29/52* (2013.01); *G11C 7/14* (2013.01); *G11C 8/08* (2013.01); *G11C 16/26* (2013.01)

(58) Field of Classification Search
  CPC .................................................. G06F 11/3495
  See application file for complete search history.

(56) References Cited

U.S. PATENT DOCUMENTS 9,330,775 B2     5/2016  Kim et al.
2021/0132800 A1* 5/2021  Papandreou ........ G06F 11/3495

* cited by examiner

*Primary Examiner* — Jason Lappas
(74) *Attorney, Agent, or Firm* — HSML P. C.

(57) ABSTRACT

This application relates to the technical field of data storage, and discloses a method for finding a common optimal reference voltage and a memory storage-system. The method includes: providing a lookup table for optimal reference voltage offset of each programmed state of target memory and a 1-bit count difference voltage offset corresponding to predetermined 1-bit count index at different time intervals; when there is a NAND device of a memory storage system with UECC or bit error rate exceeding criteria, detecting current 1-bit count difference voltage offset corresponding to the predetermined 1-bit count index, and obtaining optimal reference voltage offset in the lookup table with the current 1-bit count difference voltage offset as index; and applying the corresponding reference voltage offset to initial common reference voltage of all NAND devices of the memory storage system. This application can accurately adjust the reference voltage.

13 Claims, 4 Drawing Sheets

METHOD FOR FINDING COMMON OPTIMAL REFERENCE VOLTAGE AND MEMORY STORAGE SYSTEM

CROSS-REFERENCE TO PRIOR APPLICATION

This application claims priority to Chinese Application number CN2022103434384 which is filed on Mar. 31, 2022, the contents of which are incorporated herein by reference.

TECHNICAL FIELD

This application relates to the technical field of data storage, in particular to a method for finding a common optimal reference voltage and a memory storage system.

BACKGROUND

Non-volatile memory storage system has become an important way of storing data because the data stored within will not be lost due to power failure. Among these non-volatile memory storage systems, NAND flash memory is popular because of its advantages of low power consumption and high performance.

Figure 1:
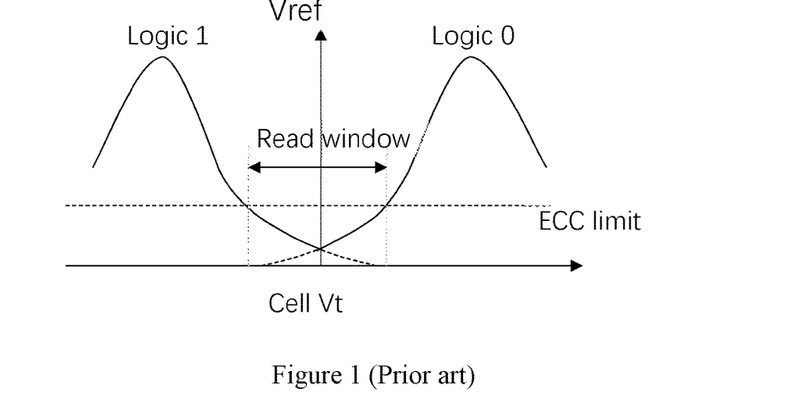
FIG. 1 is a schematic diagram for reading memory cells in prior art.

NAND memory cells are read by applying a voltage to the control gate. Taking SLC (Single Layer Cell) flash memory as an example, threshold voltage of programmed cell is higher than applied gate voltage, allowing lower current than reference current, reading as "0". When threshold voltage is lower (erased cell), cell current is higher than reference current, reading as "1", as shown in FIG. 1. For an example of TLC (three bits per cell), a cell can have eight different threshold voltages to be decoded to one of eight binary data, which requires seven reference voltages applied to cell gate at reading. The whole threshold voltage span available for a memory cell needs to be divided and allocated for each of eight states of TLC memory. It needs to be further divided by sixteen for QLC (Quad-bits per cell) which naturally has much smaller range in threshold voltage available for each state since the whole threshold voltage span of QLC can be increased only slightly from that of TLC.

Figure 2:
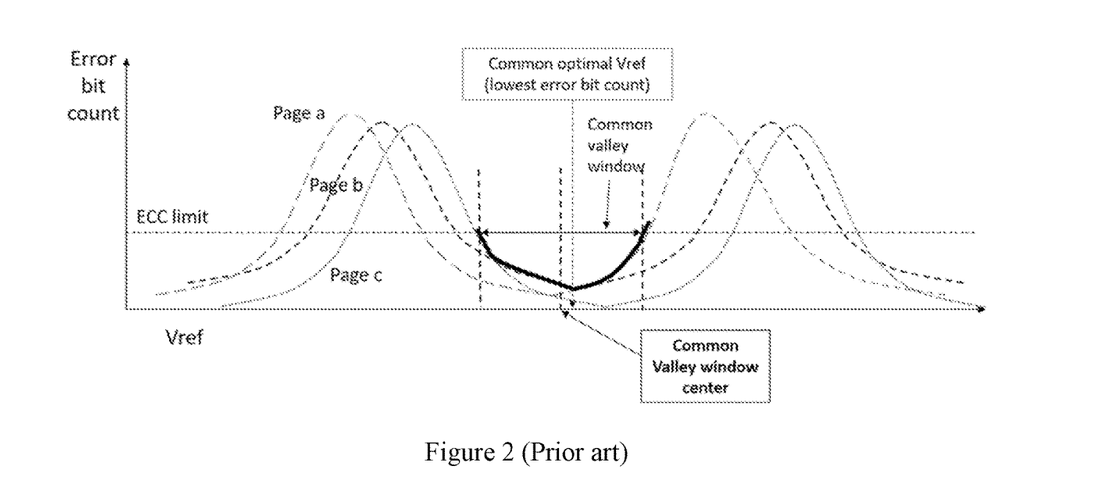
FIG. 2 is a schematic diagram of read window of memory chip in prior art.

Memory cell has essentially analog characteristics. Threshold voltage of memory cell programmed to a target state is not constant and varies by many internal and external factors: location within memory array such as where the selected cell is located along series-in NAND cell string which affects channel resistance to source, location of block (top, center or bottom of chip) where selected cell belongs to, manufacturing process variation which causes difference in programmed threshold voltages by die, external operating temperature at programming and read, aging status or retention time after programming. Reference voltages applied to control gate of selected cell and bypass cells of the same NAND string and reference current used for detecting conducting or non-conducting cell state are also affected by variation from same internal and external factors. Though a lot of efforts on chip design and manufacturing processes are made to reduce variations, a whole memory array of a memory chip gets distribution of threshold voltages for each state. When there is no overlapping of adjacent memory state distribution and reference voltage applied in-between distribution, data is read correctly without error, Distance of non-overlapping threshold voltage of adjacent states is defined as read window, as shown in FIGS. 1 and 2. A reference gate voltage applied at center of read window, defined as optimal Vref, usually gives even margin to both adjacent state distributions, offering best probability of correct reading to be guarded against variations aforementioned. As memory density per die keeps increasing and manufacturing process keeps shrinking and number of bits stored per cell increases, adjacent threshold voltage distribution became overlapped, resulting in certain percentage in error of target data which is recovered by ECC (Error Correction Code) of external controller. It is important that amount of error bit does not exceed ECC capability. In the past, NAND memory die had built-in preset reference voltages which were not allowed to be changed. As overlapping of adjacent state distribution increases to exceed ECC, a feature to adjust reference gate voltage at read with external controller became available. Calibrating reference voltage became necessary to minimize or recover errors. Calibration operation needs to deal with all the variation factors aforementioned. It is basically adjust read reference voltage applied to selected cell gate and may need to adjust multiple times until recovering data with ECC, called read-retry. Reducing iteration of multiple reading while adjusting reference voltage is essential to decrease performance hit from calibration. Proper adjustment of reference voltage to within read-window requires knowledge of how read-window is affected by various variation factors. Among them variation by cell location within a memory die has bigger impact on performance than external operating temperatures. While application system can be designed to keep operating temperature in control, limiting memory access within certain range is impossible. So it is very important to find a read window that can work for all cells of a memory die.

SUMMARY OF THE INVENTION

An object of this application is to provide a method for finding a common optimal reference voltage for certain target NAND memory space and a memory storage system, which can accurately adjust the reference voltage.

In one embodiment, the present invention provides a method for finding a common optimal reference voltage, the method comprises:
   providing a lookup table for a reference voltage offset corresponding to each read reference voltage between two adjacent states and a 1-bit count difference voltage offset corresponding to predetermined 1-bit count index at different time intervals;
   when there is a NAND device of a memory storage system with UECC or bit error rate exceeding criteria, detecting current 1-bit count difference voltage offset corresponding to the predetermined 1-bit count index, and obtaining a reference voltage offset corresponding to each read reference voltage between two adjacent states in the lookup table with the current 1-bit count difference voltage offset as index; and applying the corresponding reference voltage offset to initial common reference voltage of all NAND devices of the memory storage system.

In one embodiment, the lookup table is generated by:
   powering up the memory storage system and keeping retention;
   obtaining common reference voltage distribution corresponding to each read reference voltage between two adjacent states in several sample blocks of the memory storage system and 1-bit count difference voltage corresponding to predetermined 1-bit count index on a sample word line of the memory storage system at different time intervals;

recording reference voltage offset corresponding to each read reference voltage between two adjacent states and 1-bit count difference voltage offset corresponding to the predetermined 1-bit count index at different time intervals, and forming the lookup table for the reference voltage offset corresponding to each read reference voltage between two adjacent states and the 1-bit count difference voltage offset corresponding to the predetermined 1-bit count index at different time intervals.

In one embodiment, the memory storage system does not perform read, write, and erase operations while keeping retention.

In one embodiment, when there is a NAND device of the memory storage system with UECC or bit error rate exceeding the criteria during use of the memory storage system, detecting current 1-bit count difference voltage offset corresponding to the predetermined 1-bit count index and obtaining corresponding reference voltage offset, applying the corresponding reference voltage offset to the initial common reference voltage of all the NAND devices of the memory storage system, and if there is still a NAND device of the memory storage system with UECC or error rate exceeding the criteria, applying the corresponding reference voltage offset to the corresponding initial common reference voltage of the NAND device in which UECC or bit error rate exceeds the criteria.

In one embodiment, after the memory storage system is powered off and re-powered on, detecting current 1-bit count difference voltage offset corresponding to the predetermined 1-bit count index on a sample word line of the memory storage system and obtaining corresponding reference voltage offset, and applying the corresponding reference voltage offset to the initial common reference voltage of all NAND devices of the memory storage system.

In one embodiment, after applying the corresponding reference voltage offset to the initial common reference voltage of all NAND devices of the memory storage system, when there is a NAND device of the memory storage system with UECC or bit error rate exceeding the criteria, applying the corresponding reference voltage offset to the corresponding initial common reference voltage of the NAND device in which UECC or bit error rate exceeds the criteria.

In one embodiment, the memory storage system comprises a plurality of NAND devices, the memory storage system comprises a common reference voltage suitable for all NAND devices, and the plurality of NAND devices are divided into a plurality of groups, the NAND devices in each group having a respective common reference voltage.

In another embodiment, the present invention provides a memory storage system, the system comprises:
  one or more NAND devices; and
  a memory controller coupled to the one or more NAND devices, the memory controller storing a lookup table for a reference voltage offset corresponding to each read reference voltage between two adjacent states and a 1-bit count difference voltage offset corresponding to predetermined 1-bit count index at different time intervals, wherein the memory controller is configured to:
  when there is a NAND device of the memory storage system with UECC or bit error rate exceeding criteria, detect current 1-bit count difference voltage offset corresponding to the predetermined 1-bit count index, and obtain a reference voltage offset corresponding to each read reference voltage between two adjacent states in the lookup table with the current 1-bit count difference voltage offset as index; and
  apply the corresponding reference voltage offset to initial common reference voltage of all NAND devices of the memory storage system.

In one embodiment, the lookup table is generated by:
  powering up the memory storage system and keeping retention;
  obtaining common reference voltage distribution of each read reference voltage between two adjacent states in several sample blocks of the memory storage system at different time intervals and 1-bit count difference voltage corresponding to the predetermined 1-bit count index on a sample word line of the memory storage system;
  recording reference voltage offset corresponding to each read reference voltage between two adjacent states and 1-bit count difference voltage offset corresponding to the predetermined 1-bit count index at different time intervals, and forming the lookup table for the reference voltage offset corresponding to each read reference voltage between two adjacent states and the 1-bit count difference voltage offset corresponding to the predetermined 1-bit count index at different time intervals.

In one embodiment, the memory storage system does not perform read, write, and erase operations while keeping retention.

In one embodiment, the memory controller is further configured to: when there is a NAND device of the memory storage system with UECC or bit error rate exceeding the criteria during use of the memory storage system, detect current 1-bit count difference voltage offset corresponding to the predetermined 1-bit count index and obtain corresponding reference voltage offset, apply the corresponding reference voltage offset to the initial common reference voltage of all the NAND devices of the memory storage system, and if there is still a NAND device of the memory storage system with UECC or error rate exceeding the criteria, apply the corresponding reference voltage offset to the corresponding initial common reference voltage of the NAND device in which UECC or bit error rate exceeds the criteria.

In one embodiment, the memory controller is further configured to: after the memory storage system is powered off and re-powered on, detect current 1-bit count difference voltage offset corresponding to the predetermined 1-bit count index on a sample word line of the memory storage system and obtain corresponding reference voltage offset, and apply the corresponding reference voltage offset to the initial common reference voltage of all NAND devices of the memory storage system.

In one embodiment, the memory controller is further configured to: after applying the corresponding reference voltage offset to the initial common reference voltage of all NAND devices of the memory storage system, when there is a NAND device of the memory storage system with UECC or bit error rate exceeding the criteria, apply the corresponding reference voltage offset to the corresponding initial common reference voltage of the NAND device in which UECC or bit error rate exceeds the criteria.

A large number of technical features are described in the specification of the present application, and are distributed in various technical solutions. If a combination (i.e., a technical solution) of all possible technical features of the present application is listed, the description may be made too long. In order to avoid this problem, the various technical features disclosed in the above summary of the present application, the technical features disclosed in the various embodiments and examples below, and the various technical features disclosed in the drawings can be freely combined with each other to constitute Various new technical solutions (all of which are considered to have been described in this specification), unless a combination of such technical features is not technically feasible. For example, feature A+B+C is disclosed in one example, and feature A+B+D+E is disclosed in another example, while features C and D are equivalent technical means that perform the same function, and technically only choose one, not to adopt at the same time. Feature E can be combined with feature C technically. Then, the A+B+C+D scheme should not be regarded as already recorded because of the technical infeasibility, and A+B+C+E scheme should be considered as already documented.

BRIEF DESCRIPTION OF THE FIGURES

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Embodiments of the present application provide a method for finding a common optimal reference voltage and a memory storage system, the voltage distribution under retention of the memory storage system varies with charging or discharging, and the lookup table for the optimal reference voltage offset of each state of target memory array and the 1-bit count difference voltage offset corresponding to the predetermined 1-bit count index at different time intervals is provided, and the 1-bit count difference voltage offset corresponding to the predetermined 1-bit count index varies with the retention time, which can be used to determine current retention time and to obtain the optimal reference voltage offset of each state of target memory array, thus can be used to precisely adjust the reference voltage of the memory storage system when there is a NAND device of the memory storage system with UECC or bit error rate exceeding the criteria.

In the following description, numerous technical details are set forth in order to provide the readers with a better understanding of the present application. However, those skilled in the art can understand that the technical solutions claimed in the present application can be implemented without these technical details and various changes and modifications based on the following embodiments.

In order to make the objects, technical solutions and advantages of the present application clearer, embodiments of the present application will be further described in detail below with reference to the accompanying drawings.

Figure 3:
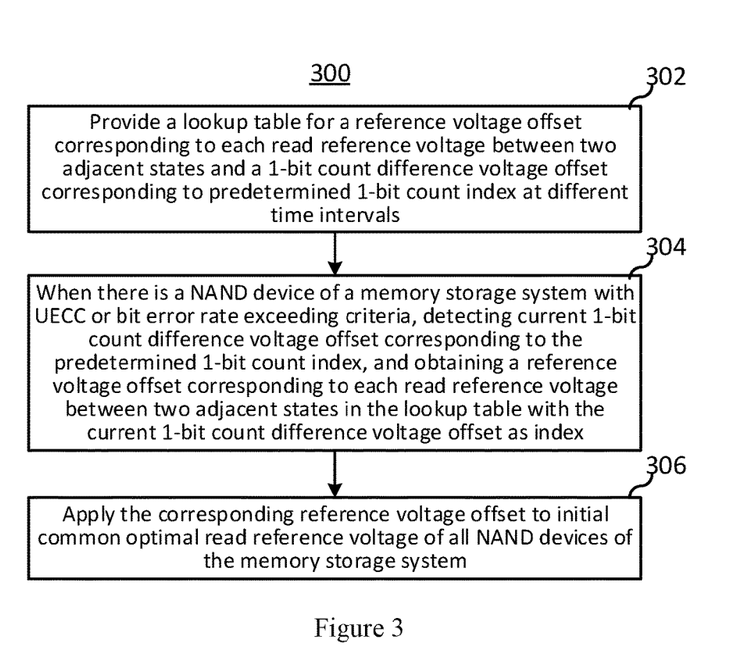
FIG. 3 is a schematic flowchart of a method for finding a common optimal reference voltage according to an embodiment of this application.

The first embodiment of this application relates to a method for finding the common optimal reference voltage, and FIG. 3 shows a flowchart of the method 300 for finding the common optimal reference voltage in an embodiment, which includes the following steps:

Step 302, providing a lookup table for optimal reference voltage offset of each state of target memory array and a 1-bit count difference voltage offset corresponding to predetermined 1-bit count index at different retention time intervals.

It should be noted that the term "1-bit count" means that quantity of 1-bit changed when reading a page of target NAND with current reference voltage N from reading with adjacent reference voltage N−1, the term "1-bit count difference voltage" means that reference voltage corresponding to a predetermined 1-bit count index, and the term "1-bit count difference voltage offset" means that difference of reference voltage corresponding to the predetermined 1-bit count index after a period of time.

In one embodiment, the lookup table is generated by the following steps:

Firstly, the memory storage system is powered on and kept retention. In one embodiment, the memory system does not perform read, write, and erase operations while keeping retention.

In one embodiment, the memory storage system may comprise a plurality of NAND NAND devices, each NAND comprises one or more dies. The memory storage system has a single common reference voltage for all NAND devices. And, the plurality of NAND devices may be divided into a plurality of groups, and the NAND devices in each group have a respective common reference voltage, i.e., the memory storage system may have a plurality of common reference voltages applicable to different groups of NAND devices.

Generally, the optimal read reference voltage for multiple NAND pages is to scan the read voltage distribution of each page to find the highest error bit count of all pages under the error correction code (ECC) limit for each read voltage distribution, and identify the voltage with the lowest error bit count as the optimal common reference voltage to the multiple pages. The variation of read voltage distribution is mainly caused by the variation of reference voltage between different NAND NAND devices. The valley window corresponding to the highest error bit count of all pages under ECC limit is usually asymmetric. Since the reference voltage at its center under ECC limit provides a more balanced edge reference voltage distance than the lowest error bit count point, the reference voltage at its center can be selected as the common optimal reference voltage to the multiple pages.

A common optimal reference voltage can be extracted from the NAND devices or all NAND devices of the memory storage system. Due to the long time to scan all pages, it is preferable to scan the sample pages or sample blocks of each NAND device to find the common optimal reference voltage. As the number of the NAND devices in the memory storage system increases and the ECC valley window shrinks, the plurality of NAND devices can be grouped into multiple NAND device groups with a smaller number or a similar valley window range. Each NAND device group has its own common optimal reference voltage.

Secondly, common reference voltage distribution corresponding to each read reference voltage between two adjacent states in several sample blocks of the memory storage system and 1-bit count difference voltage corresponding to predetermined 1-bit count index on a sample word line of the memory storage system at different time intervals are obtained.

Figure 4:
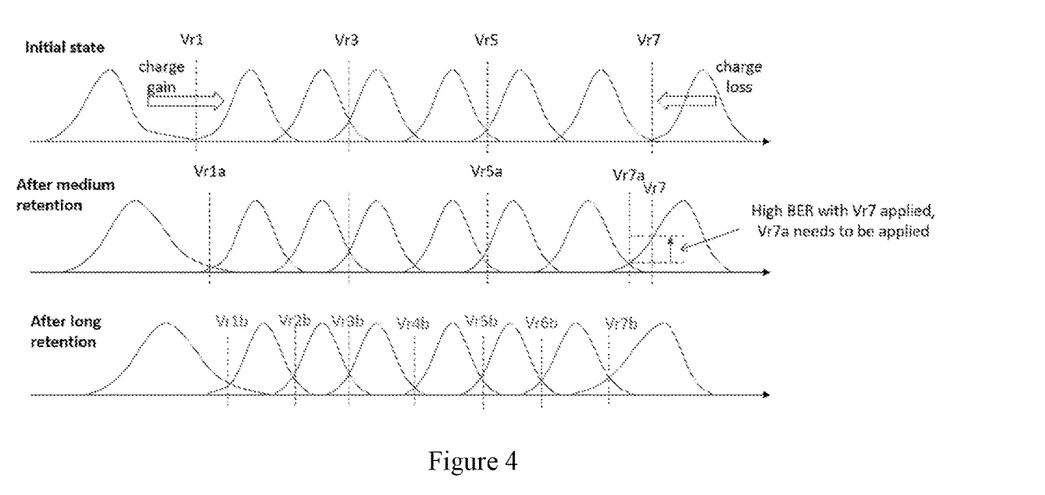
FIG. 4 is a schematic diagram of a threshold voltage distribution of NAND memory array when the memory storage system is kept retention according to an embodiment of this application.

FIG. 4 shows a diagram of a threshold voltage distribution of TLC memory array with read reference voltages between two adjacent states when the memory storage system is kept retention according to an embodiment. The reference voltage corresponding to the predetermined 1-bit count index shifts to different degrees by different length of the memory storage system retention time. It can be seen from the figure that the longer the retention time, initial optimal read reference voltage such as Vr7 is off the center of read window after retention, causing higher BER. New read reference voltage, Vr7a, is now necessary to be applied as new optimal Vref. Adjustment of each read reference voltage can be defined as offset to initial optimal reference voltage. The longer in retention time, the greater reference voltage offset is necessary.

Figure 5:
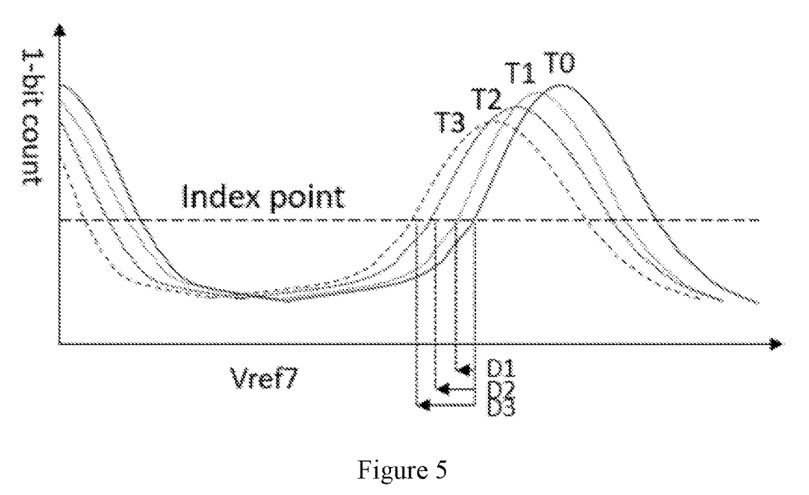
FIG. 5 is a schematic diagram of a threshold voltage distribution of NAND memory array for level-7 programmed state marking predetermined 1-bit count index shifts at different retention times according to an embodiment of this application.
Figure 6:
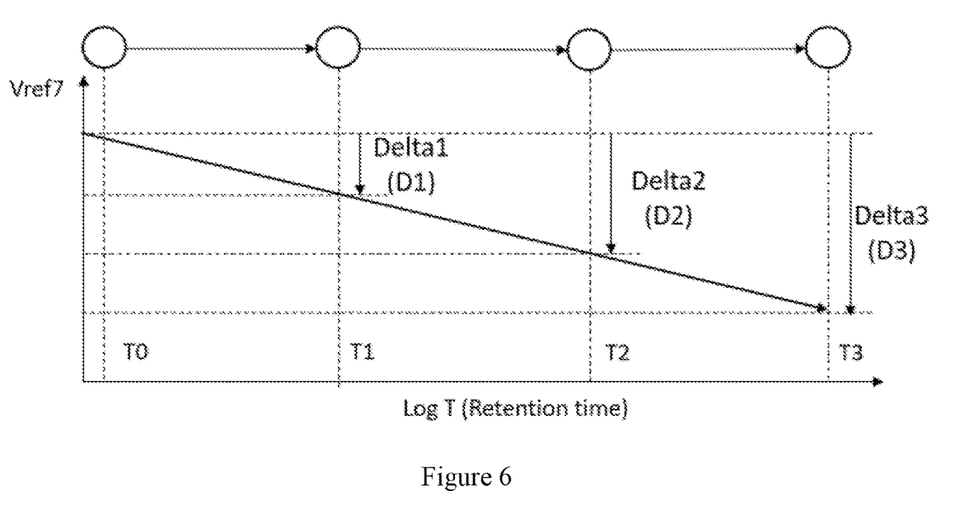
FIG. 6 is a schematic diagram of a 1-bit count difference voltage offset corresponding to predetermined 1-bit count index at different retention times according to an embodiment of this application.

FIG. 5 is a diagram of a portion of TLC memory array threshold voltage distribution showing shift of programmed level 7 state by retention time. The shift amount by retention time can be represented by shift offset of read reference voltage corresponding to predetermined 1-bit count as an index at different retention times according to an embodiment. The reference voltage corresponding to the 1-bit count index point (for example, 300) is 1-bit count difference voltage, and the 1-bit count difference voltage offset under different retention times. For example, from the retention time T0 to T1, the offset of the 1-bit count difference voltage is D1, from the retention time T1 to T2, the offset of the 1-bit count difference voltage is D2, and from the retention time T2 to T3, the offset of the 1-bit count difference voltage is D3. FIG. 6 is a schematic diagram of a 1-bit count difference voltage offset corresponding to predetermined 1-bit count index at different retention times according to an embodiment.

Then, optimal reference voltage offset of each state of target NAND and 1-bit count difference voltage offset corresponding to the predetermined 1-bit count index at different time intervals are recorded. And the lookup table for the optimal reference voltage offset and the 1-bit count difference voltage offset corresponding to the predetermined 1-bit count index at different time intervals is formed. Table 1 below shows the lookup table in one embodiment.

TABLE 1

Optimal reference voltage offset of each state of target NAND and the 1-bit count difference voltage offset corresponding to the boundary bit memory cell at different retention time

| Retention time | 1-bit count difference offset (Vref7) | Vref7 Offset | Vref6 offset | Vref5 offset | Vref4 offset | Vref3 offset | Vref2 offset | Vref1 offset |
|---|---|---|---|---|---|---|---|---|
| T0 | +10 | G | F | E | D | C | B | A |
| T1 | −2(+8) | −2 | −1 | 0 | 0 | 0 | 0 | +1 |
| T2 | −4(+6) | −3 | −2 | −1 | 0 | 0 | +1 | +3 |
| T3 | −6(+4) | −4 | −3 | −−2 | −1 | 0 | +2 | +4 |

The voltage distribution under retention of the memory storage system varies with charging or discharging and the 1-bit count difference voltage offset of the predetermined 1-bit count index varies with the retention time, so it can be used to determine current retention time. As the variation of cell threshold voltage distribution causes the bit error rate (BER) to exceed the acceptable criteria, this application introduces the optimal reference voltage setting method to adapt to the current retention time, which can accurately adjust the reference voltage.

Step 304, when there is a NAND device of the memory storage system with UECC or bit error rate exceeding criteria, detecting current 1-bit count difference voltage offset corresponding to the predetermined 1-bit count index, and obtaining a optimal reference voltage offset of each state of target NAND in the lookup table with the current 1-bit count difference voltage offset as index.

Step 306, applying the corresponding reference voltage offset to initial common reference voltage of all NAND devices of the memory storage system.

In one embodiment, when there is a memory NAND device in which UECC or bit error rate exceeds the criteria during use of the memory storage system, the current 1-bit count difference voltage offset corresponding to the predetermined 1-bit count index is detected and corresponding reference voltage offset is obtained, and the corresponding reference voltage offset is applied to the initial common reference voltage of all the memory NAND devices of the memory storage system. If the ECC can be corrected at this time, the correction process ends. If the memory storage system still has a memory NAND device in which UECC or bit error rate exceeds the criteria, the corresponding reference voltage offset is applied to the corresponding initial common reference voltage of the memory NAND device in which UECC or bit error rate exceeds the criteria.

The following is a specific example to illustrate. Assuming that the memory storage system has four NAND devices, so there is a group of common optimal reference voltage shared by the four NAND devices, as shown in Table 2 below, each of the four NAND devices also has a respective common optimal reference voltage, as shown in Table 3 below.

TABLE 2

Common optimal reference voltage shared by a group of memory NAND devices

Common reference voltage for the group of NAND devices

| | V1 | V2 | V3 | V4 | V5 | V6 | V7 | V8 | V9 | V10 | V11 | V12 | V13 | V14 | V15 |
|---|---|---|---|---|---|---|---|---|---|---|---|---|---|---|---|
| Initial value | FB | FF | FE | FF | FD | FD | FE | FD | FE | FC | FB | FC | FC | FA | FF |

TABLE 3

Common optimal reference voltage for each NAND device in a group of NAND devices Common reference voltage for each NAND device in the group of NAND devices

| | V1 | V2 | V3 | V4 | V5 | V6 | V7 | V8 | V9 | V10 | V11 | V12 | V13 | V14 | V15 |
|---|---|---|---|---|---|---|---|---|---|---|---|---|---|---|---|
| NAND device #1 initial value | FA | 0 | FE | FE | FD | FC | FD | FC | FC | F9 | FA | FC | FC | FA | FE |
| NAND device #2 initial value | F9 | 0 | FE | FE | FC | FD | FC | FB | FC | F9 | F9 | F8 | F9 | F7 | F9 |
| NAND device #3 initial value | FA | 0 | FF | 0 | FF | FD | FE | FD | FD | FB | FB | FB | FC | FA | FD |
| NAND device #4 initial value | FA | 0 | FF | 0 | FF | FF | FE | FD | FD | FC | FB | FC | FB | FA | FC |

The process described above is used to obtain the lookup table of the 1-bit count difference voltage offset corresponding to the predetermined 1-bit count index at different retention time (Table 4 below) and the lookup table of the optimal reference voltage offset at different retention time (Table 5 below).

TABLE 4

1-bit count difference voltage offset corresponding to the predetermined 1-bit count index at different retention time.

| Retention time | 1-bit count difference offset |
|---|---|
| T0 | 0 |
| T1 | −2 |
| T2 | −3 |
| T3 | −4 |

TABLE 5

Reference voltage offset corresponding to each state under different retention time

| Retention time | V1 | V2 | V3 | V4 | V5 | V6 | V7 | V8 | V9 | V10 | V11 | V12 | V13 | V14 | V15 |
|---|---|---|---|---|---|---|---|---|---|---|---|---|---|---|---|
| T0 | 0 | 0 | 0 | 0 | 0 | 0 | 0 | 0 | 0 | 0 | 0 | 0 | 0 | 0 | 0 |
| T1 | 0 | 0 | 1 | 0 | 1 | 0 | 1 | 0 | 0 | 0 | 0 | −1 | −1 | −1 | −1 |
| T2 | −1 | 0 | 0 | 0 | 0 | 0 | 0 | 0 | 0 | 0 | −1 | −2 | −2 | −2 | −2 |
| T3 | −1 | 0 | 1 | 0 | 0 | 0 | 0 | 0 | 0 | 0 | −1 | −2 | −2 | −3 | −2 |

Take QLC as an example, the correction process may have two stages:

(1) When UECC or ECC exceeds the criteria, we first find out a group of reference voltage offsets through the retention time corresponding to the reference voltage index table, then add the reference voltage offsets to a group of common optimal reference voltages shared by the group of NAND devices, and then try to read and correct with the group of optimal read voltages. If the correction process is successful, the correction process may end.

(2) If UECC still occurs, then the corresponding group of reference voltage offsets will be added into the common optimal reference voltage of the NAND device where UECC occurs, and the optimal read voltage for this NAND device will be applied, then trying to read and correct it. The reason for this is that the optimal read voltage of a single NAND device is more accurate than a group of shared optimal read voltages, so the probability of UECC being corrected is also higher.

In one embodiment, after the memory storage system is powered off and re-powered on, detecting the current 1-bit count difference voltage offset corresponding to the predetermined 1-bit count index on a sample word line of the memory storage system and obtaining the corresponding reference voltage offset, and applying the corresponding reference voltage offset to the initial common reference voltage of all NAND devices of the memory storage system. In one embodiment, after applying the corresponding reference voltage offset to the initial common reference voltage of all NAND devices of the memory storage system, when there is a NAND device of the memory storage system with UECC or bit error rate exceeding the criteria, applying the corresponding reference voltage offset to the corresponding initial common reference voltage of the NAND device in which UECC or bit error rate exceeds the criteria.

Any memory cell selected in the target memory space can be read correctly with common optimal reference voltage. Target memory space can be a NAND die or portion of a die such as a block. It can also be multiple memory dies. As read window variations increase with bigger memory space such as that of multiple dies, common valley window as shown in FIG. 2 decreases. Therefore it is very important to accurately find common valley window. While common optimal reference voltage deals with read window variations from within-memory such as cell location of memory die or across dies, it does not handle variations from external factors such as retention. Cell Vt distribution shift in retention increases by retention time and shift amount in given retention increases with higher programmed states as shown in FIG. 4. Retention shift is generally dependent on memory technology node and does not vary much among mass-production of same node. This invention introduces an index point of preset bit count with corresponding reference voltage. Vt distribution shifts after retention time causes the index point to shift. Amount of change in reference voltage of same index bit count can be pre-characterized with sample memory devices by different retention time for target node NAND as shown in FIG. 5. It is best to select index point in highest programmed state such as level 7 state of TLC memory as delta reference voltage in given retention time is bigger than other levels, giving best measurability among all programmed states. Finding shift amount in reference voltage for the index bit count allows for a good estimate of progressed retention time. Retention time of target NAND can be divided into several ranges up to cover maximum target retention time. Each range needs to have similar or equal shift amount. Optimal set of each range is tuned to the center point of shift amount. It makes BER get lowest at retention point of each range and can get highest at edge of the range. The span of each range is defined so that optimal set tuned to center of each range can still suppress BER with proper margin when reading at edge point of each retention range.

Figure 7:
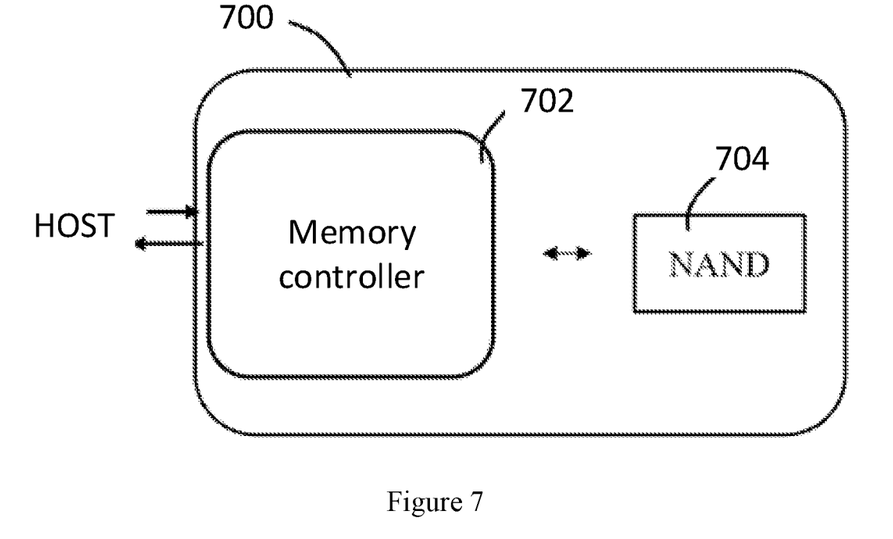
FIG. 7 is a block diagram of a memory storage system according to an embodiment of this application.

A second embodiment of this application relates to a memory storage system, and FIG. 7 illustrates a memory storage system 700 according to one embodiment of the present disclosure. The memory storage system 700 may include a memory NAND device 704 and a memory controller 702 coupled to the memory NAND device 704. When the memory controller 702 is coupled to the host, it can provide the host with data storage and/or access to the stored data. The memory controller 702 according to this embodiment receives control signals and performs an operation corresponding to the control signals. The memory NAND device 704 sends the execution result of the operation corresponding to the control signals to the memory controller 702. The storage 704 may be a non-volatile memory (NVM)-based storage device, and may include, for example, NAND flash memory, NOR flash memory, magnetoresistive random access memory (MRAM), resistive random access memory (RRAM), phase change random access memory (PCRAM), Nano-RAM, etc. NAND flash memory may be used as an example. It should be noted that the memory storage system 700 may include a plurality of NAND devices, and the NAND device 704 may be shown as representatives of the plurality of NAND devices.

The memory controller 702 may include a processor, memory, and ECC engine. The processor may be a computer processor, such as, but not limited to, a microprocessor or microcontroller. The memory may be a non-transitory computer-readable storage medium, such as DRAM or SRAM, to store computer-executable instructions that will be executed by the processor. The ECC engine can correct errors in storage data retrieved from memory NAND device 704.

The memory controller 702 stores a lookup table for optimal reference voltage offset of each state of target NAND and a 1-bit count difference voltage offset corresponding to predetermined 1-bit count index at different time intervals, and the lookup table may be stored in the memory, for example. The lookup table is generated by the process described in detail above. The memory controller is configured to when there is a NAND device of the memory storage system with UECC or bit error rate exceeding criteria, detect current 1-bit count difference voltage offset corresponding to the predetermined 1-bit count index, and obtain optimal reference voltage offset in the lookup table with the current 1-bit count difference voltage offset as index; apply the corresponding reference voltage offset to initial common reference voltage of all NAND devices of the memory storage system. In addition, if the ECC can be corrected at this time, the correction process ends. If there is still a NAND device of a memory storage system with UECC or error rate exceeding the criteria, apply the corresponding reference voltage offset to the corresponding initial common reference voltage of the NAND device in which UECC or bit error rate exceeds the criteria.

It should be noted that in this specification of the application, relational terms such as the first and second, and so on are only configured to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, article, or device that comprises a multiple elements includes not only those elements but also other elements, or elements that are inherent to such a process, method, item, or device. Without more restrictions, the element defined by the phrase "comprise(s) a/an" does not exclude that there are other identical elements in the process, method, item or device that includes the element. In this specification of the application, if it is mentioned that an action is performed according to an element, it means the meaning of performing the action at least according to the element, and includes two cases: the action is performed only on the basis of the element, and the action is performed based on the element and other elements. Multiple, repeatedly, various, etc., expressions include 2, twice, 2 types, and 2 or more, twice or more, and 2 types or more types.

All documents mentioned in this specification are considered to be included in the disclosure of this application as a whole, so that they can be used as a basis for modification when necessary. In addition, it should be understood that the above descriptions are only preferred embodiments of this specification, and are not intended to limit the protection scope of this specification. Any modification, equivalent replacement, improvement, etc. made within the spirit and principle of one or more embodiments of this specification should be included in the protection scope of one or more embodiments of this specification.

In some cases, the actions or steps described in the claims can be performed in a different order than in the embodiments and still achieve desired results. In addition, the processes depicted in the drawings do not necessarily require the specific order or sequential order shown in order to achieve the desired results. In some embodiments, multitasking and parallel processing are also possible or may be advantageous.

What is claimed is:

1. A method for finding a common optimal reference voltage, comprising:
    providing a lookup table for a reference voltage offset corresponding to each read reference voltage between two adjacent states and a 1-bit count difference voltage offset corresponding to predetermined 1-bit count index at different time intervals;
    when there is a NAND device of a memory storage system with UECC or bit error rate exceeding criteria, detecting current 1-bit count difference voltage offset corresponding to the predetermined 1-bit count index, and obtaining a reference voltage offset corresponding to each read reference voltage between two adjacent states in the lookup table with the current 1-bit count difference voltage offset as index; and
    applying the corresponding reference voltage offset to initial common optimal read reference voltage of all NAND devices of the memory storage system.

2. The method for finding the common optimal reference voltage of claim 1, wherein the lookup table is generated by:
    powering up the memory storage system and keeping retention;
    obtaining common reference voltage distribution corresponding to each read reference voltage between two adjacent states in several sample blocks of the memory storage system and 1-bit count difference voltage corresponding to predetermined 1-bit count index on a sample word line of the memory storage system at different time intervals;
    recording reference voltage offset corresponding to each read reference voltage between two adjacent states and 1-bit count difference voltage offset corresponding to the predetermined 1-bit count index at different time intervals, and forming the lookup table for the reference voltage offset corresponding to each read reference voltage between two adjacent states and the 1-bit count difference voltage offset corresponding to the predetermined 1-bit count index at different time intervals.

3. The method for finding the common optimal reference voltage of claim 2, wherein the memory storage system does not perform read, write, and erase operations while keeping retention.

4. The method for finding the common optimal reference voltage of claim 1, wherein when there is a NAND device of the memory storage system with UECC or bit error rate exceeding the criteria during use of the memory storage system, detecting current 1-bit count difference voltage offset corresponding to the predetermined 1-bit count index and obtaining corresponding reference voltage offset, applying the corresponding reference voltage offset to the initial common reference voltage of all the NAND devices of the memory storage system, and if there is still a NAND device of the memory storage system with UECC or error rate exceeding the criteria, applying the corresponding reference voltage offset to the corresponding initial common reference voltage of the NAND device in which UECC or bit error rate exceeds the criteria.

5. The method for finding the common optimal reference voltage of claim 1, wherein after the memory storage system is powered off and re-powered on, detecting current 1-bit count difference voltage offset corresponding to the predetermined 1-bit count index on a sample word line of the memory storage system and obtaining corresponding reference voltage offset, and applying the corresponding reference voltage offset to the initial common reference voltage of all NAND devices of the memory storage system.

6. The method for finding the common optimal reference voltage of claim 5, wherein after applying the corresponding reference voltage offset to the initial common reference voltage of all NAND devices of the memory storage system, when there is a NAND device of the memory storage system with UECC or bit error rate exceeding the criteria, applying the corresponding reference voltage offset to the corresponding initial common reference voltage of the NAND device in which UECC or bit error rate exceeds the criteria.

7. The method for finding the common optimal reference voltage of claim 1, wherein the memory storage system comprises a plurality of NAND devices, the memory storage system comprises a common reference voltage suitable for all NAND devices, and the plurality of NAND devices are divided into a plurality of groups, the NAND devices in each group having a respective common reference voltage.

8. A memory storage system, comprising:
    one or more NAND devices; and
    a memory controller coupled to the one or more NAND devices, the memory controller storing a lookup table for a reference voltage offset corresponding to each read reference voltage between two adjacent states and a 1-bit count difference voltage offset corresponding to predetermined 1-bit count index at different time intervals, wherein the memory controller is configured to:
    when there is a NAND device of the memory storage system with UECC or bit error rate exceeding criteria, detect current 1-bit count difference voltage offset corresponding to the predetermined 1-bit count index, and obtain a reference voltage offset corresponding to each read reference voltage between two adjacent states in the lookup table with the current 1-bit count difference voltage offset as index, and apply the corresponding reference voltage offset to initial common reference voltage of all NAND devices of the memory storage system.

9. The memory storage system of claim 8, wherein the lookup table is generated by:
  powering up the memory storage system and keeping retention;
  obtaining common reference voltage distribution corresponding to each read reference voltage between two adjacent states in several sample blocks of the memory storage system and 1-bit count difference voltage corresponding to predetermined 1-bit count index on a sample word line of the memory storage system at different time intervals;
  recording reference voltage offset corresponding to each read reference voltage between two adjacent states and 1-bit count difference voltage offset corresponding to the predetermined 1-bit count index at different time intervals, and forming the lookup table for the reference voltage offset corresponding to each read reference voltage between two adjacent states and the 1-bit count difference voltage offset corresponding to the predetermined 1-bit count index at different time intervals.

10. The memory storage system of claim 9, wherein the memory storage system does not perform read, write, and erase operations while keeping retention.

11. The memory storage system of claim 8, wherein the memory controller is further configured to: when there is a NAND device of the memory storage system with UECC or bit error rate exceeding the criteria during use of the memory storage system, detect current 1-bit count difference voltage offset corresponding to the predetermined 1-bit count index and obtain corresponding reference voltage offset, apply the corresponding reference voltage offset to the initial common reference voltage of all the NAND devices of the memory storage system, and if there is still a NAND device of the memory storage system with UECC or error rate exceeding the criteria, apply the corresponding reference voltage offset to the corresponding initial common reference voltage of the NAND device in which UECC or bit error rate exceeds the criteria.

12. The memory storage system of claim 8, wherein the memory controller is further configured to: after the memory storage system is powered off and re-powered on, detect current 1-bit count difference voltage offset corresponding to the predetermined 1-bit count index on a sample word line of the memory storage system and obtain corresponding reference voltage offset, and apply the corresponding reference voltage offset to the initial common reference voltage of all NAND devices of the memory storage system.

13. The memory storage system of claim 12, wherein the memory controller is further configured to: after applying the corresponding reference voltage offset to the initial common reference voltage of all NAND devices of the memory storage system, when there is a NAND device of the memory storage system with UECC or bit error rate exceeding the criteria, apply the corresponding reference voltage offset to the corresponding initial common reference voltage of the NAND device in which UECC or bit error rate exceeds the criteria.

* * * * *